United States Patent
Palata et al.

(10) Patent No.: US 6,664,661 B1
(45) Date of Patent: Dec. 16, 2003

(54) PROXIMITY SWITCH

(75) Inventors: Jaromir Palata, Friedrichshafen (DE); Jörg Schulz, Lustenau (AT)

(73) Assignee: i f m electronic GmbH, Essen (DE)

( * ) Notice: Subject to any disclaimer, the term of this patent is extended or adjusted under 35 U.S.C. 154(b) by 249 days.

(21) Appl. No.: 09/688,744

(22) Filed: Oct. 16, 2000

(30) Foreign Application Priority Data

Oct. 15, 1999 (DE) .......................... 199 49 998

(51) Int. Cl.$^7$ .......................... H03D 13/08; B66B 13/26
(52) U.S. Cl. .......................... 307/112; 340/562; 361/179
(58) Field of Search .......................... 340/562–564; 307/112, 116, 117; 361/179–181

(56) References Cited

U.S. PATENT DOCUMENTS

| | | | |
|---|---|---|---|
| 4,016,490 A | * 4/1977 | Weckenmann et al. | 361/181 |
| 4,191,894 A | * 3/1980 | Noda et al. | 307/116 |
| 4,208,695 A | * 6/1980 | Noda et al. | 307/116 |
| 4,240,528 A | * 12/1980 | Kraus | 340/562 |
| 4,316,180 A | * 2/1982 | LeVert | 340/562 |
| 4,349,814 A | * 9/1982 | Akehurst | 307/116 |
| 4,663,542 A | * 5/1987 | Buck et al. | 361/180 |
| 6,225,710 B1 | * 5/2001 | Palata et al. | 307/109 |
| 6,335,684 B1 | * 1/2002 | Eisenmann et al. | 340/562 |

FOREIGN PATENT DOCUMENTS

| | | | |
|---|---|---|---|
| DE | 198 12 626 | 9/1999 | |
| DE | 198 13 013 | 9/1999 | |
| GB | 2 279 750 A | * 1/1995 | ......... H03K/17/955 |

* cited by examiner

Primary Examiner—Gregory J. Toatley, Jr.
(74) Attorney, Agent, or Firm—Nixon Peabody LLP; David S. Safran

(57) ABSTRACT

A proximity switch is described, specifically a capacitive proximity switch, with two signal transmitters (1, 2) and with one signal receiver (3), a first signal output (4, 5) of each of the two signal transmitters (1, 2) being connected to one another and to a first signal input (6) of the signal receiver (3), and a second signal output (7, 8) of each of the two signal transmitters (1, 2) being connected via a respective signal transmission path (9, 10) to a second signal input (11) of the signal receiver (3), and at least one of the two signal transmission paths (9, 10) can be influenceable by an actuating object.

21 Claims, 3 Drawing Sheets

PROXIMITY SWITCH

BACKGROUND OF THE INVENTION

1. Field of the Invention

Figure 1:
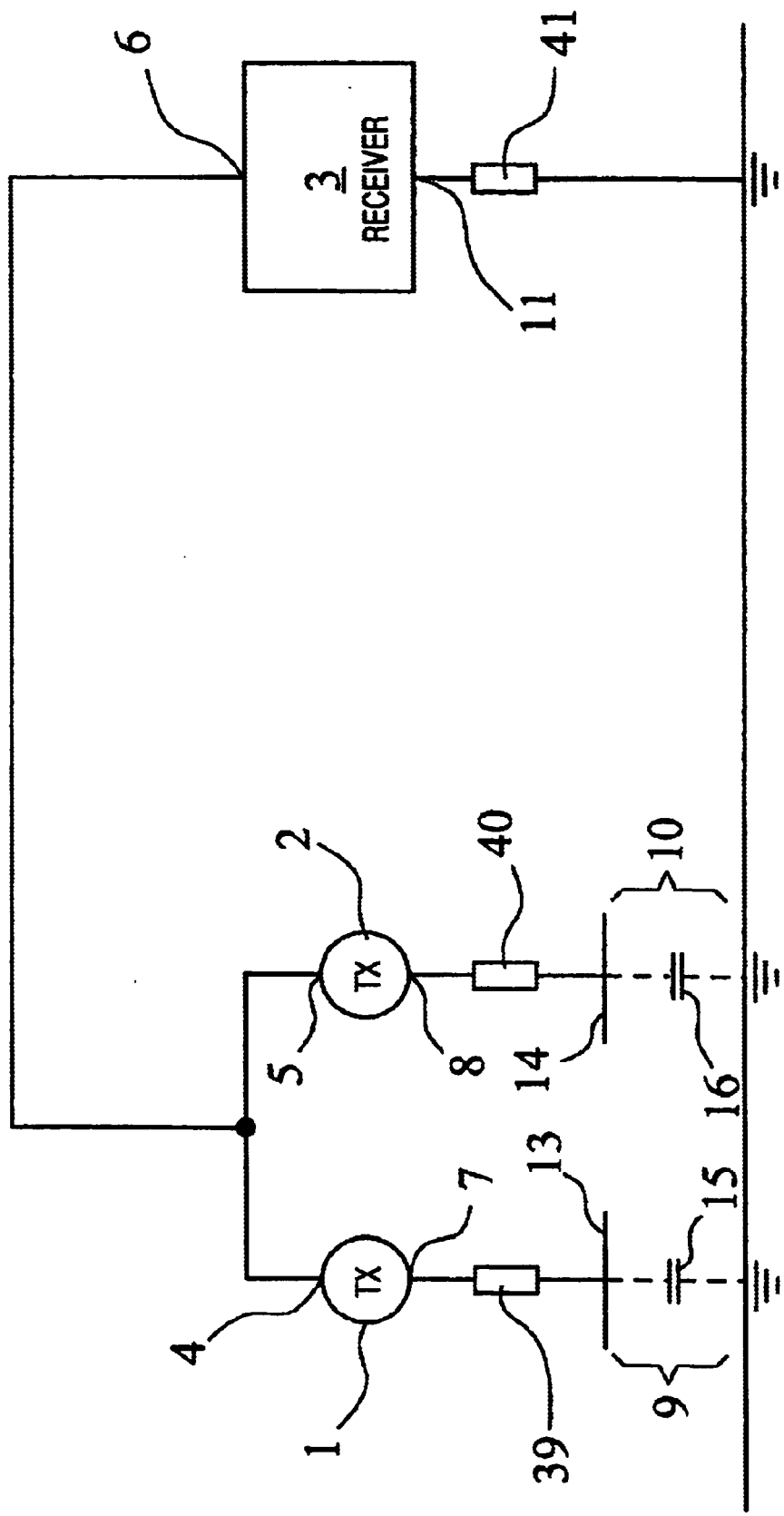

The invention relates to a proximity switch, especially a capacitive proximity switch.

2. Description of Related Art

Proximity switches, especially inductive, capacitive and optoelectronic proximity switches, are used in a host of quite different applications. They can be proximity switches which operate without contact, i.e., those in which an actuating object simply approaches the sensitive surface of the proximity switch, and also proximity switches which operate with contact, i.e., those in which an actuating object touches the sensitive surface of the proximity switch.

In particular, proximity switches are known which have two sensitive surfaces, also called receiving electrodes, and one active surface, also called a transmitting electrode. In these proximity switches, the approach of an actuating object leads to the impedances changing between the transmitting electrode and the first receiving electrode, on the one hand, and between the transmitting electrode and the second receiving electrode, on the other. Consequently, a first current flows from the transmitting electrode to the first receiving electrode and a second current flows to the second receiving electrode. But, it can also be such that only the voltages on the receiving electrodes change without currents flowing.

In a capacitive electrode, the changing impedances between the transmitting electrode and the first receiving electrode, on the one hand, and between the transmitting electrode and the second receiving electrode, on the other, are the changing impedances.

SUMMARY OF THE INVENTION

In the following the invention is described with respect to capacitive proximity switches. The problem underlying the invention, the consequent object and the achievement of this object however are not limited to capacitive proximity switches. In particular everything which is explained below also applies to inductive and also optoelectronic proximity switches.

In the proximity switches underlying the invention, as already mentioned, there are a transmitting electrode and two receiving electrodes; in other words, one signal transmitter and two signal receivers belong to the known proximity switches underlying the invention. Therefore one signal receiver is assigned to each of the two receiving electrodes, in other words a processing channel is connected downstream. This is associated with the system-dictated defect that the processing of the received signal of the first receiving electrode via the first processing channel and in the first signal receiver, and the processing of the received signal of the second receiving electrode via the second processing channel and in the second signal receiver can differ from one another.

The object of the invention is to devise a proximity switch of the type under consideration, especially a capacitive proximity switch, which is not subject to the aforementioned system-induced defect.

The subject matter of the invention is, first of all, essentially a proximity switch, especially a capacitive proximity switch, with two signal transmitters and with one signal receiver, the two signal transmitters, on the one hand, being connected to one another each with their first signal output, and to the first signal input of the signal receiver, and on the other hand each with their second signal output via one signal transmission path at a time is or can be connected to the second signal input of the signal receiver and at least one of the two signal transmission paths can be influenced by an actuating object. In doing so, preferably the "same signal" or "similar signals" are delivered by the signal transmitters. The "same signals" are either dc voltage signals with the same voltage amplitude or ac voltage signals with the same frequency and the same voltage amplitude. "Similar signals" means either dc voltage signals with a voltage amplitude which is not the same or ac voltage signals with the same frequency and a voltage amplitude which is not the same. AC voltage signals with a frequency which is not the same are therefore neither "same signals" nor "similar signals".

If it was assumed above that each of the two signal transmitters has a first signal output and second signal output, this should only indicate that one signal voltage can arise only between two signal outputs or one signal stream can flow only via two signal outputs; with the statement that each of the two signal transmitters has two signal outputs, it should not be indicated that two, optionally different signal voltages arise or signal streams flow. The statement that the signal receiver has two signal inputs is intended to indicate accordingly that one signal voltage can arise only between two signal inputs and one signal stream can flow only between two signal inputs.

It was stated above that at least one of the two signal transmission paths between the two signal transmitters and the signal receiver can be influenced, specifically by one actuating object. That the two signal transmission paths can also be influenced by one actuating object also implicitly belongs to this statement.

It applies both to the proximity switches underlying the invention and also to the proximity switch as claimed in the invention that simply the approach of an actuating object can be detected. But for this purpose actually proximity switches with two signal receivers, as in the prior art, or with two signal transmitters, as provided in accordance with the invention, are not necessary; the simple approach of an actuating object can also be detected with one signal transmitter and one signal receiver. Proximity switches with two signal receivers as in the prior art or with two signal transmitters according to the invention rather also make it possible to detect whether an actuating object has approached nearer one of the two receiving electrodes as provided in the prior art, or one of the two transmitting electrodes as provided as claimed in the invention, than the other receiving electrode or the other transmitting electrode. With proximity switches of the type under consideration here, therefore, with two receiving electrodes, as in the prior art, or with two transmitting electrodes in accordance with the invention, it can also be detected from which direction the actuating object is approaching.

The major difference between the proximity switches underlying the invention and the proximity switches in accordance with the invention can be explained as follows.

In the proximity switches known in the prior art which underlie the invention, the actuating object produces two electrical signals which as such are routed by the two receiving electrodes via the assigned processing channels. Following the processing channels, then, the processed electrical signals are subtracted. Conversely, in the proximity switch in accordance the invention, the two signals which have been influenced in the signal transmission path and which originate from the two signal transmitters are subtracted in front of the single signal receiver or in front of the single receiving electrode. Only one processing channel is connected downstream of the sole receiving electrode so that the system-induced defect explained above, which can occur in the two processing channels, cannot occur as caused by the system according to the invention.

It is especially advantageous if, in the proximity switch in accordance with the invention, the two signal transmitters generate frequency-spread signals. This can be done by the two signal transmitters for generating the frequency-spread signals each having one noise signal source or preferably by one noise signal source being assigned jointly to the two signal transmitters for generating the frequency-spread signals. Regarding what is achieved by frequency-spread signals, reference is made to all the disclosed contents of German patent disclosure document 198 13 013 and corresponding commonly owned, co-pending U.S. patent application Ser. No. 09/275,869, filed Mar. 25, 1999 now U.S. Pat. No. 6,225,710 B1.

It is furthermore especially advantageous if, in the proximity switch in accordance with the invention, the two signal transmitters generate signals which are phase shifted by 180°. This results in that, when the actuating object influences the two signal transmission paths identically, a zero signal is supplied to the sole receiving electrode or the sole signal receiver, so that any deviation from the zero signal which occurs with identical influencing of the signal transmission paths can be recognized and processed especially well.

It was pointed out above that, when a zero signal is supplied to the sole receiving electrode or the sole signal receiver, any deviation from the zero signal can be recognized and processed especially well. Consequently, one especially preferred embodiment of the proximity switch according to the invention to which special importance is assigned is additionally characterized in that at least one of the two signal transmitters or the output signals of at least one of the two signal transmitters is controlled, preferably such that the signal difference is zero at the first signal input of the signal receiver, therefore a zero signal is also sent to the sole receiving electrode or the signal input of the sole signal receiver when an actuating object does not influence the two signal transmission paths identically.

In particular, there are now a host of possibilities for embodying and developing the proximity switch in accordance with the invention. In this regard, reference is made both to the description of the embodiments of the proximity switch which are shown in the drawings and described below.

SUMMARY OF THE INVENTION

Figure 2:
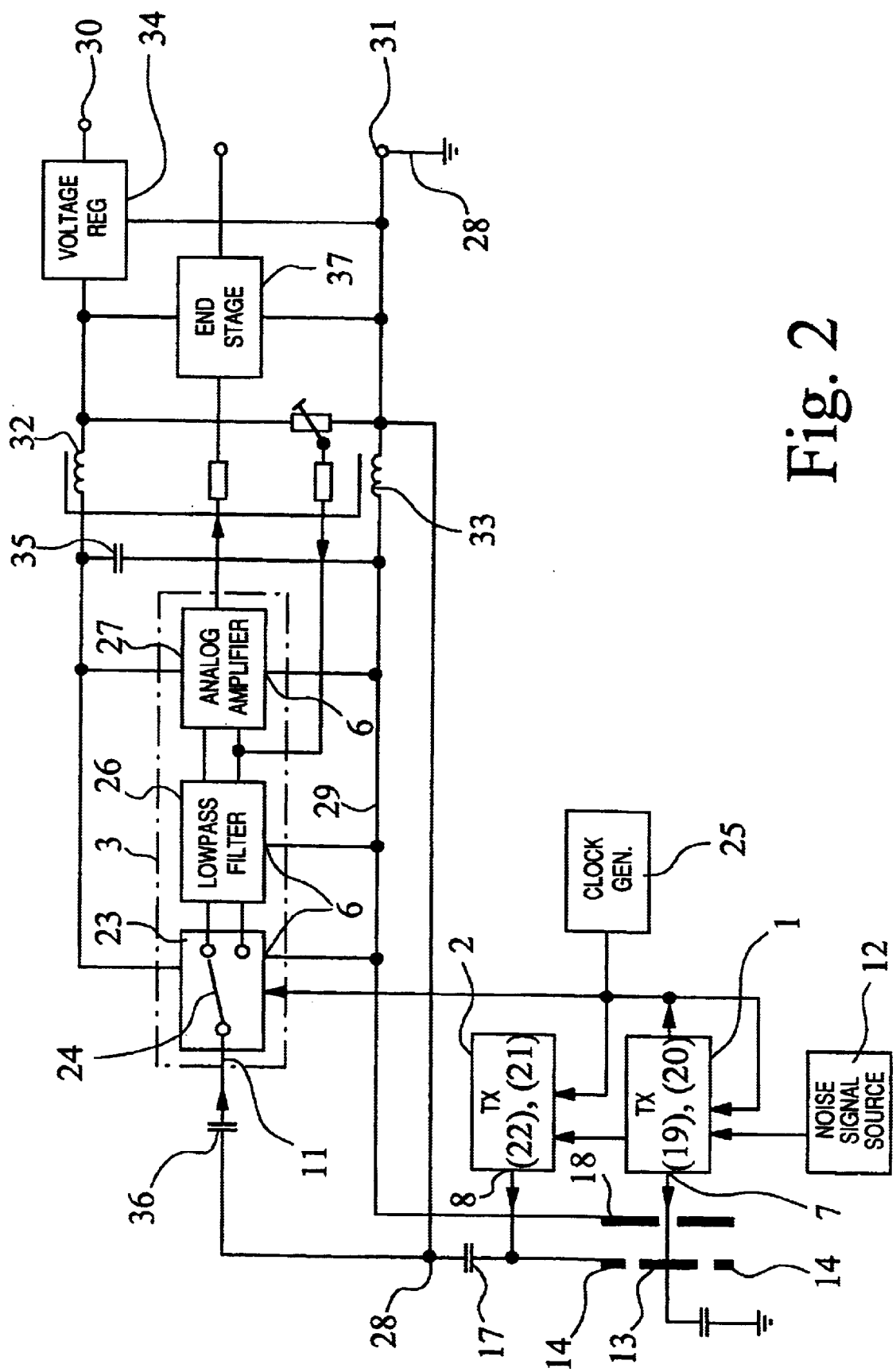
Figure 3:
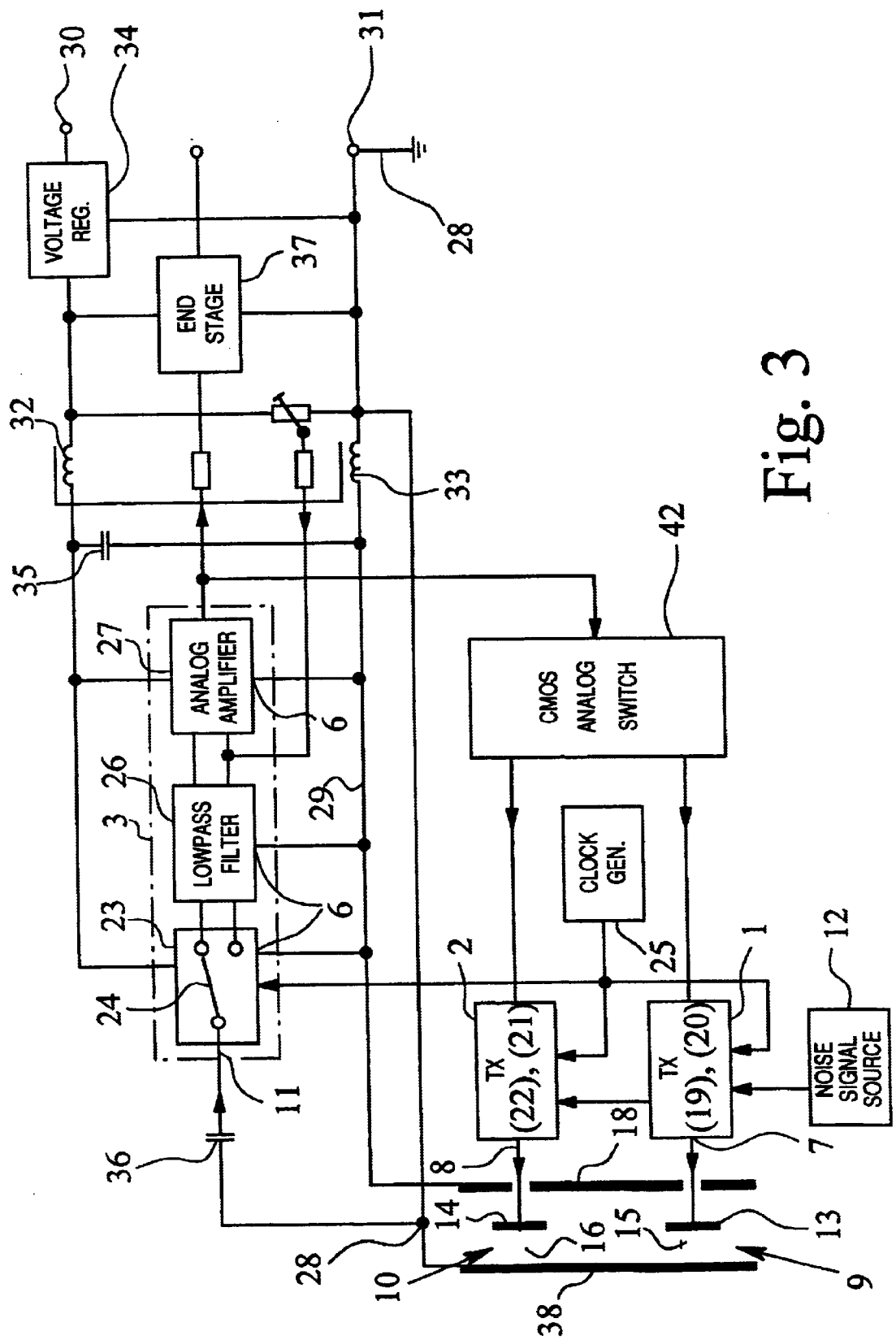

FIG. 1 shows a very schematic representation for explaining the proximity switch as in accordance with the invention, FIG. 2 shows a first embodiment of the proximity switch in accordance with the invention, and FIG. 3 shows a second embodiment of the proximity switch in accordance with the invention.

DETAILED DESCRIPTION OF THE INVENTION

The figures, FIG. 1 very schematically, show the circuit diagram of a proximity switch in accordance with the invention, specifically a capacitive proximity switch. This proximity switch according to the invention, first of all, includes two signal transmitters 1, 2 and a signal receiver 3. The two signal transmitters 1, 2 are, on the one hand, connected to one another each with their first signal output 4, 5, and to the first signal input 6 of the signal receiver 3, on the other hand, are or can be connected by their second signal output 7, 8 via a respective signal transmission path 9, 10 to the second signal input 11 of the signal receiver 3. At least one of the two signal transmission paths 9 or 10 can be influenced by an actuating object which is not shown.

For the embodiments which are shown in FIGS. 2 and 3, it applies that the two signal transmitters 1, 2 generate frequency-spread signals. To do this, in the embodiments shown one noise signal source 12 is assigned to the two signal transmitters 1,2. Regarding what is achieved by the two signal transmitters 1, 2 in conjunction with the noise signal source 12 generating frequency-spread signals, reference is made again to all the disclosed contents of German patent disclosure document 198 13 013 and corresponding U.S. patent application Ser. No. 09/275,869.

That there are two transmitting electrodes 13, 14 corresponds to the statement that the proximity switch in accordance with the invention includes two signal transmitters 1, 2. On the one hand, the transmitting electrodes 13, 14 are connected to the two signal outputs 7, 8 of the signal transmitters 1, 2. On the other hand, between the transmitting electrodes 13, 14 and the ground potential are the signal transmission paths 9, 10 which are shown only in FIGS. 1 and 3. Otherwise, it is indicated only in FIGS. 1 and 3 that the signal transmission paths 9, 10 include capacitances 15, 16 which change when the actuating object approaches. While, in the embodiments as shown in FIGS. 1 and 3, one of the two capacitances 15 or 16 can be the response or measurement capacitance and the other of the two capacitances 16 or 15 can be the reference capacitance, in the embodiment shown in FIG. 2, there is a special capacitance 17 which is made as a capacitor as the reference capacitance. Finally, FIGS. 2 and 3 show, that in the embodiments shown, there is a ground electrode 18 in addition to the transmitting electrodes 13 and 14.

It has already been pointed out above that it is furthermore especially advantageous if, in the proximity switch according to the invention, the two signal transmitters 1, 2 generate signals which are phase shifted by 180°, because this results in that, when the actuating object influences the two signal transmission paths 9, 10 identically to the sole signal receiver 3, a zero signal is supplied so that any deviation from the zero signal which occurs with identical influencing of the signal transmission paths 9, 10 can be recognized and processed especially well. Consequently, for all the embodiments shown, it is provided that the two signal transmitters 1, 2 generate signals which are phase shifted by 180°. In the embodiments shown, this is accomplished by the two signal transmitters 1, 2 consisting of a signal generator 19 which is common to the two signal transmitters 1, 2 and a changeover switch 20, 21 which is in series with the signal generator 19 and by an inverter 22 being connected upstream or downstream of one of the two changeover switches 20, 21, which, in the embodiments shown in FIGS. 2 and 3, is the changeover switch 21.

For the embodiments of the capacitive proximity switches in accordance with the invention which are shown in FIGS. 2 and 3, it furthermore applies that the signal receiver 3 has a phase-sensitive synchronous rectifier 23 which is connected downstream of the second signal input 11 and which, for its part, on the input side, has a changeover switch 24. Preferably, the two changeover switches 20, 21 which belong to the signal transmitters 1, 2 and which are in series to the signal generator 19, and the changeover switch 24 of the synchronous rectifier 23 are realized by a multiplexer. (For the structure and manner of operation of a multiplexer, reference is made to Tietze, Schenk *Semiconductor Circuit Engineering,* 10th edition, section 9.6.3, pages 226 to 228). The two changeover switches 20, 21 which are in series to the signal generator 19 and the changeover switch 24, of the synchronous rectifier 23 are simultaneously triggered switching, in the embodiments shown in FIGS. 2 and 3, by a common clock generator 25. Otherwise, it applies to the embodiments of the capacitive proximity switches, in accordance with the invention which are shown n FIGS. 2 and 3, that the signal receiver 3 has a lowpass filter 26 and an analog amplifier 27 which is preferably made as a comparator provided with hysteresis.

The following is of importance for the embodiments of the capacitive proximity switches according to the invention which are shown in FIGS. 2 and 3.

As can be taken from FIGS. 2 and 3, the signal receiver 3 with its first signal input 6 which is shown three times, and with its second signal input 11, is between the frame potential and the ground potential 28. If we correctly consider the ground potential 28 to be a fixed reference potential, at the signal inputs 6 and 11 of the signal receiver 3 a signal can only take effect or be present when "floating" of the frame potential 29 is possible or enabled.

As shown in FIGS. 2 and 3, the illustrated embodiments of the capacitive proximity switches as claimed in the invention are provided with two operating voltage terminals 30, 31 which are used to connect the proximity switch to the operating voltage, the operating voltage terminal 31 being at ground potential 28. So that, at this point, the frame potential 29 can float relative to the ground potential 28, the frame potential 29 which is ac voltage- or dc voltage-connected to the ground potential 29 is high frequency-decoupled from the ground potential by a preferably current-compensated choke 32, 33 being connected downstream of each of the operating voltage terminals 30, 31. In doing so, the choke 33 is parallel to the signal inputs 6, 11 of the signal receiver 3, by which, due to the low impedance for an ac voltage with 50 Hz, so-called system hum is suppressed.

Otherwise, it is pointed out here that in the embodiments of the capacitive proximity switches according to the invention which are shown in FIGS. 2 and 3, there are still other function elements, specifically a voltage regulator 34, connected on the input side, between the operating voltage terminal 30 and the choke 32, a blocking capacity 35, to the ends of the chokes 32, 33 which are away from the operating voltage terminals 30, 31, a coupling capacitor 36 in front of the second signal input 11 of the signal receiver 3 and an end stage 37 which follows the signal detector 3 and which can be provided with a protective circuit.

Furthermore, reference is made to differences between the embodiments of the capacitive proximity switches, in accordance with the invention which are shown n FIGS. 2 and 3, which relate only to the execution in the area of the transmitting electrodes 13, 14. In the embodiment as shown in FIG. 2, the second transmitting electrode 14 concentrically surrounds the first transmitting electrode 13. The capacitive proximity switch made in this way is insensitive laterally, because the second transmitting electrode 14 acts against the first transmitting electrode 13. Conversely, in the embodiment as shown in FIG. 3, the two transmitting electrodes 13, 14 are located next to one another, opposite a counter-electrode 38 which is connected to ground potential 28. This embodiment enables, for example, counting of labels, recognition of adhesion sites and comparison of material thicknesses.

Reference is made to the feature which applies to the embodiment as shown in FIG. 1. In this embodiment, in both signal transmission paths 9, 10 there is a signal delay element, specifically a resistor 39, 40. There is another resistor in front of the second signal input 11 of the signal receiver 3. The resistors 39, 40, 41 lead to the signal streams flowing somewhat time-delayed so that the synchronous rectifier 23 is "ready to receive" when the signal streams "arrive", although the changeover switch 24 which belongs to the synchronous rectifier 23 switches simultaneously with the two changeover switches 20, 21 which belong to the signal transmitters 1, 2.

The embodiment as shown in FIG. 3 differs from the embodiment as shown in FIG. 2 mainly in that in the embodiment shown in FIG. 3 the two signal transmitters 1, 2 or the output signals of the two signal transmitters 1, 2 are controlled such that at the first signal input 6 of the signal receiver 3 the signal difference originating from the output signals of the two signal transmitters 1, 2, therefore the received signal on the signal receiver 3, is zero, therefore a zero signal is sent to the signal receiver 3.

To control the two signal transmitters 1, 2 or the output signals of the two signal transmitters 1, 2, the output signal of the phase-sensitive synchronous rectifier 23 could be used. In the embodiment shown in FIG. 3 however, to control the two signal transmitters 1, 2 or the output signals of the signal transmitters 1, 2, the output signal of the analog amplifier 27 is used.

With the stipulation of controlling the two signal transmitters 1, 2 or the output signals of the two signal transmitters 1, 2 such that at the signal input 6 of the signal receiver 3, the signal difference resulting from the output signals of the signal transmitters 1, 2 is zero, one skilled in the art can easily control details of the circuitry which need not be described in detail here.

That which has been explained above essentially functionally, nevertheless in a manner which can be easily revised for one skilled in the art, is shown somewhat more concretely in the embodiment shown in FIG. 3. This embodiment is additionally characterized in that, to control the output signals of the signal transmitters 1, 2, a dc voltage-controlled linear amplitude modulator or HF generator, preferably in the form of a CMOS analog switch 42, is connected downstream of the output of the analog amplifier 27. This CMOS analog switch 42 has the special advantage of linearity, i.e., the dc voltage signal supplied to it is transformed 1:1 into an ac voltage signal.

It was pointed out above that, in the embodiments shown in FIGS. 1 and 2, the two signal transmitters 1, 2 consist of a signal generator 19 which is common to both signal transmitters 1, 2, and other components. If, as stated above, a dc voltage controlled linear amplitude modulator or HF generator, especially a CMOS analog switch 42, is used to control the two signal transmitters 1, 2 or the output signals of the two signal transmitters 1, 2, then the signal generator 19 can be omitted, specifically the dc voltage-controlled linear amplitude modulator or the HF generator, especially in the form of a CMOS analog switch 42, can be used as the signal generator for the signal transmitters 1, 2.

It was described above with reference to the embodiment shown in FIG. 3 that the two signal transmitters 1, 2 or the output signals of the two signal transmitters 1, 2 are controlled. But, it is also possible to control only the signal transmitter 1 or only the signal transmitter 2. If the signal transmitter 1 is considered to be a measurement transmitter and the signal transmitter 2 to be a reference transmitter, the output signal of the signal transmitter 1, therefore as the measurement signal, and the output signal of the signal transmitter 2 as the reference signal, the following can be stated as an evaluation:

If the output signal of the signal transmitter 1, therefore the measurement signal, is controlled, it is advantageously achieved that when a measured value increases there is no modulation limit, that equalization of the characteristic is achieved and that the transfer factor, therefore the steepness, changes (dynamic compression). If the output signal of the signal transmitter 2, therefore the reference signal is controlled, this is advantageous to the extent that there is a transfer factor which is independent of the reference capacitance, the sensitivity is therefore always the same. The disadvantage here however is that the control range is limited. To control both the output signal of the signal transmitter 1, therefore the measurement signal, as well as the output signal of the signal transmitter 2, therefore the reference signal, it is an especially good idea if both signal transmission paths can be operationally influenced, as was explained further above.

Finally, it should be pointed out that what was explained above with reference to the embodiment as shown in FIG. 3, therefore controlling the output signals of the two signal transmitters 1, 2 or the output signal of the signal transmitter 1 or the output signal of the signal transmitter 2, mainly enables the sensitivity of the proximity switch made in this way to be set electronically with relative ease.

What is claimed is:

1. Proximity switch comprising two signal transmitters and one signal receiver, a first signal output of each of the two signal transmitters being connected to one another and to a first signal input of the signal receiver, and a second signal output of each of the signal transmitters, via a respective signal transmission path, be connected to a second signal input of the signal receiver, and wherein both of the signal transmission paths are influenceable by an actuating object.

2. Proximity switch as claimed in claim 1, wherein the two signal transmitters a re adapted to generate frequency-spread signals.

3. Proximity switch as claimed in claim 2, wherein the two signal transmitters for generating the frequency-spread signals each have a noise signal source.

4. Proximity switch as claimed in claim 2, wherein a noise signal source is assigned jointly to the two signal transmitters for generating the frequency-spread signals.

5. Proximity switch as claimed in claim 1, wherein the two signal transmitters generate signals which are phase shifted by 180°.

6. Proximity switch as claimed in claim 5, wherein a signal generator is common to the two signal transmitters and each of the signal transmitters has a changeover switch which is in series with the signal generator; and wherein an inverter is connected to the changeover switch of one of the signal transmitters.

7. Proximity switch as claimed in claim 1, wherein the signal receiver has a phase-sensitive synchronous rectifier which is connected downstream of the second signal input.

8. Proximity switch as claimed in claim 7, wherein the synchronous rectifier has a changeover switch on an input side.

9. Proximity switch as claimed in claim 8, wherein a signal generator is common to the two signal transmitters and the two signal transmitters each have a changeover switch which is in series with the signal generator; wherein an inverter is connected to the changeover switch of one of the signal transmitters; wherein each changeover switch is in series with the signal generator; and wherein the changeover switch of the synchronous rectifier is formed by a multiplexer.

10. Proximity switch as claimed in claim 9, wherein the changeover switches which are in series with the signal generator and the changeover switch of the synchronous rectifier are simultaneously triggered.

11. Proximity switch as claimed in claim 1, wherein the signal receiver has a lowpass filter.

12. Proximity switch as claimed in claim 1, wherein the signal receiver has one of an analog amplifier and a comparator.

13. Proximity switch as claimed in claim 1, wherein, in a signal delay element is provided in at least one of the signal transmission paths.

14. Proximity switch as claimed in claim 1, wherein two operating voltage terminals are provided for connecting the proximity switch to an operating voltage; and wherein a choke is connected downstream of each of the operating voltage terminals.

15. Proximity switch as claimed in claim 14, wherein at least one of a choke and an RC element is connected to the signal inputs of the signal receiver.

16. Proximity switch as claimed in claim 1, wherein at least one of an output signal of at least one of the two signal transmitters and one of the two signal transmitters is controlled.

17. Proximity switch as claimed in claim 16, wherein at least the output signal of one signal transmitter is controlled such that a signal difference is zero at the first signal input of the signal receiver.

18. Proximity switch as claimed in claim 7, wherein at least one of an output signal of at least one of the two signal transmitters and one of the two signal transmitters is controlled by said phase-sensitive synchronous rectifier.

19. Proximity switch as claimed in claim 2, wherein at least one of an output signal of at least one of the two signal transmitters and one of the two signal transmitters is controlled by an output signal of an analog amplifier.

20. Proximity switch as claimed in claim 7, wherein at least one of a dc voltage-controlled linear amplitude modulator and an HF generator is connected downstream of the output of one of the synchronous rectifier and an output of an analog amplifier to control at least one of an output signal of at least one of the two signal transmitters and one of the two signal transmitters.

21. Proximity switch as claimed in claim 20, wherein one of a dc voltage-controlled linear amplitude modulator and HF generator forms the signal generator of at least one of the signal transmitters.

* * * * *